United States Patent
Yun

(10) Patent No.: US 9,500,691 B2
(45) Date of Patent: Nov. 22, 2016

(54) APPARATUS AND METHOD FOR DETECTING DISCONNNECTION OF LAMPS

(71) Applicant: Hyundai Motor Company, Seoul (KR)

(72) Inventor: Hyun Chul Yun, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/687,296

(22) Filed: Apr. 15, 2015

(65) Prior Publication Data

US 2016/0129829 A1    May 12, 2016

(30) Foreign Application Priority Data

Nov. 6, 2014 (KR) ................ 10-2014-0153942

(51) Int. Cl.
| | |
|---|---|
| G01R 31/02 | (2006.01) |
| B60Q 11/00 | (2006.01) |
| G01R 31/00 | (2006.01) |
| H05B 37/03 | (2006.01) |

(52) U.S. Cl.
CPC ............. *G01R 31/02* (2013.01); *B60Q 11/00* (2013.01); *G01R 31/006* (2013.01); *H05B 37/03* (2013.01)

(58) Field of Classification Search
CPC ........ B60Q 11/007; B60Q 1/38; B60Q 1/50; B60Q 2300/052; B60Q 2300/054; B60Q 2300/21; B60Q 1/0076; B60Q 11/00; B60Q 2300/146; B60Q 2300/314; H05B 33/0815; H05B 33/0842; H05B 37/0227; H05B 37/038; H05B 37/0218; H05B 37/03; G01D 5/14; G01R 31/02; G01R 31/006
See application file for complete search history.

(56) References Cited

U.S. PATENT DOCUMENTS

| | | | | |
|---|---|---|---|---|
| 4,819,117 | A * | 4/1989 | Brennan | H02H 1/043 323/901 |
| 5,034,659 | A * | 7/1991 | Taniguchi | H05B 37/038 315/130 |
| 6,388,426 | B1 * | 5/2002 | Yokoo | G01R 31/3648 320/136 |
| 6,420,832 | B2 * | 7/2002 | Rabine | H05B 39/09 307/10.8 |
| 6,982,648 | B2 * | 1/2006 | Cros | B60Q 11/00 307/10.8 |
| 7,269,535 | B2 * | 9/2007 | Kishimoto | B60L 3/0023 702/182 |
| 2010/0156324 | A1 * | 6/2010 | Nagase | H05B 33/089 315/307 |

FOREIGN PATENT DOCUMENTS

| | | |
|---|---|---|
| JP | H08-69885 A | 3/1996 |
| JP | 2001-004690 A | 1/2001 |
| JP | 2007-246017 A | 9/2007 |
| JP | 2008-049974 A | 3/2008 |
| JP | 2009-241665 A | 10/2009 |
| JP | 2011-251664 A | 12/2011 |
| JP | 2012-232613 A | 11/2012 |
| KR | 10-2010-0082603 A | 7/2010 |

* cited by examiner

Primary Examiner — Vibol Tan
(74) Attorney, Agent, or Firm — Mintz Levin Cohn Ferris Glovsky and Popeo, P.C.; Peter F. Corless

(57) ABSTRACT

An apparatus and method for detecting a disconnection of lamps are provided. The apparatus includes a power supply that is configured to supply power to a vehicle and a controller. The controller receives operation power for at least one lamp mounted within the vehicle and supplies the operation power to the at least one lamp. In addition, the controller measures an inrush current value generated from the at least one lamp for a plurality of time intervals and detects the disconnection of the at least one lamp based on the inrush current value.

14 Claims, 2 Drawing Sheets

APPARATUS AND METHOD FOR DETECTING DISCONNNECTION OF LAMPS

CROSS-REFERENCE TO RELATED APPLICATION

This application is based on and claims the benefit of priority to Korean Patent Application No. 10-2014-0153942, filed on Nov. 6, 2014 in the Korean Intellectual Property Office, the disclosure of which is incorporated herein in its entirety by reference.

TECHNICAL FIELD

The present disclosure relates to an apparatus and a method for detecting a disconnection of lamps, and more particularly, to an apparatus and a method for detecting a disconnection of lamps by confirming inrush current values for each time interval over a predetermined period of time.

BACKGROUND

Generally, various lamps that provide driving intention and information regarding a vehicle to other vehicles when the vehicle is driven at night (e.g., during poor lighting conditions) or the vehicle is driven in an area in which the surrounding environment is dark, for example, numerous lamps such as a stop lamp (R/L), a turn signal lamp (R/L), a tail lamp (R/L), a rear marker lamp (R/L), a back up lamp (R/L), and license plate number lamps are mounted within the vehicle, to inform drivers of other vehicles and pedestrians of the driving intention of the subject vehicle through each independent function of the lamps. Accordingly, to flicker various types of lamps mounted within the vehicle, wirings which connect each lamp may be connected to a multi-function switch and connected to a cluster for instructing information regarding the flickering of the lamps.

When the disconnection of the lamps occurs, the related art confirms whether the lamps are disconnected based on an input generated in the multi-function switch which is the lamp control switch after the vehicle starts. As a result, the related art has a problem in that the disconnection of the lamps may be confirmed only when a power supply of the multi-function switch is turned on.

SUMMARY

The present disclosure provides an apparatus and a method for detecting a disconnection of lamps that detects whether the lamps are disconnected by confirming inrush current values for each time interval just after a vehicle starts and notifying a driver of the disconnection of the lamps.

Another aspect of the present disclosure provides an apparatus and a method for detecting a disconnection of lamps that provides information regarding the nearest service center from a current position of a vehicle to a driver when a disconnection of lamps is detected.

According to an exemplary embodiment of the present disclosure, an apparatus for detecting a disconnection of lamps may include: a power supply configured to supply power to a vehicle and a controller configured to receive supply operation power to at least one lamp mounted within the vehicle, configured to supply the operation power to the at least one lamp, measure a inrush current value generated from the at least one lamp for each time interval, and detect the disconnection of the at least one lamp based on the inrush current value.

The controller may be configured to supply the power and confirm whether a multi-function switch is turned on or off. The controller may also be configured to supply the operation power to the at least one lamp when the multi-function switch is turned off and perform a pre-stored lamp control algorithm to operate the at least one lamp when the multi-function switch is in a turn on state. Additionally, the controller may be configured to supply the operation power to the at least one lamp and then split a critical time into a plurality of time intervals and measure the inrush current values for each time interval.

The controller may then be configured to confirm that errors (e.g., failures or disconnections) occur in the at least one lamp when the inrush current values for the plurality of time intervals do not correspond to a normal range (e.g., a predetermined range). The controller may also be configured to confirm that the disconnection occurs when the confirmed error count is equal to or greater than a threshold value and output the confirmed result. The controller may be configured to confirm information regarding the nearest service center from the vehicle.

According to another exemplary embodiment of the present disclosure, a method for detecting a disconnection of lamps may include: detecting a power on of a vehicle; receiving operation power for at least one lamp mounted within the vehicle when the power on is detected; supplying the operation power to the at least one lamp and measuring inrush current values generated from the at least one lamp for each time interval; detecting the disconnection of the at least one lamp based on the measured inrush current value; and outputting the disconnection detection result.

The method may further include: after detecting of the power on of the vehicle, confirming whether a multi-function switch is turned on or off. The receiving of the operation power for the at least one lamp may include receiving the operation power when the multi-function switch is in a turn off state. The method may further include: performing a pre-stored lamp control algorithm to operate the at least one lamp when the multi-function switch is in a turn on state.

The detecting of the disconnection of the at least one lamp may include: splitting a critical time into a plurality of time intervals after the operation power is received for the at least one lamp; and measuring the inrush current values for each of the plurality of split time intervals. Additionally, the detecting of the disconnection of the at least one lamp may include: confirming that errors occur in the at least one lamp when the measured inrush current values do not correspond to a normal range (e.g., are beyond the predetermined range); and detecting that the disconnection occurs when the error count is equal to or greater than a threshold value. The method may further include: after outputting the disconnection detection result, confirming and outputting information regarding the nearest service center from the vehicle.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
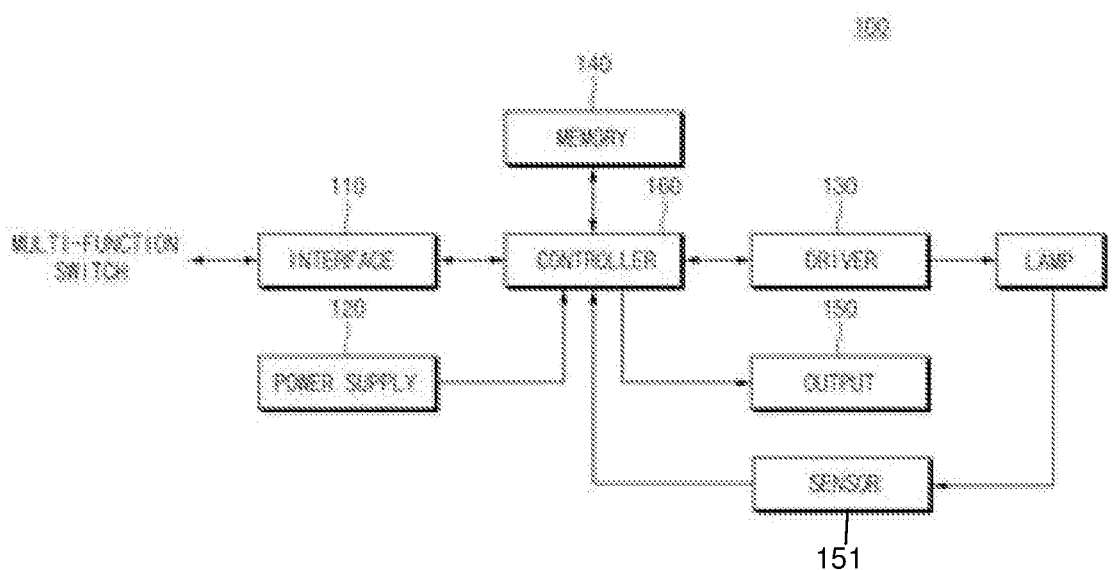
FIG. 1 is an exemplary block diagram illustrating main components of an apparatus for detecting a disconnection of lamps according to an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, various exemplary embodiments of the present disclosure will be described with reference to the accompanying drawings. The exemplary embodiments of the present disclosure may be variously changed and variously practiced, but specific exemplary embodiments are illustrated in the accompanying drawings and detailed contents thereof will be described. However, it is to be understood that various exemplary embodiments of the present disclosure are not limited to the specific exemplary embodiments, but include all modifications, equivalents, and substitutions included in the spirit and the scope of the present disclosure. In describing the drawings, like components are denoted by like reference numerals.

FIG. 1 is an exemplary block diagram illustrating main components of an apparatus for detecting a disconnection of lamps according to an exemplary embodiment of the present disclosure. Referring to FIG. 1, an apparatus 100 for detecting a disconnection of lamps according to an exemplary embodiment of the present disclosure may include an interface 110, a power supply 120, a driver 130, a memory 140, an output 150, and a controller 160. The controller 160 may be configured to operate the interface 110, the power supply 120, the memory 140, the driver 130, and the output 150.

The interface 110 may be connected to a multi-function switch configured to collect signals from each switch one-to-one corresponding to various types of lamps mounted within a vehicle to select flickering (e.g., on or off state) of the lamps via a network and may be configured to transmit flicker signals of the lamps transmitted from the multi-function switch to the controller 160 side based on a set protocol. The power supply 120 may be configured to regulate power supplied from a battery at a set switching frequency when an ignition key is turned on or a vehicle starts to supply operation power to each lamp mounted within the vehicle. The driver 130 may be configured to flicker each lamp based on a control signal applied from the controller 160.

The memory 140 may be configured to store a lamp control algorithm to operate the lamps based on an operation of the vehicle and a driving intention of a driver of the vehicle by the control signal generated from the controller 160 when the multi-function switch is turned on. The memory 140 may also be configured to store a table which may detect the disconnection of the lamps when the operation power is supplied to the lamps in a state in which the multi-function switch is turned off. In particular, the table may be as shown in the following Table 1. In the table, a critical time may be split into a plurality of time intervals (e.g., section A, section B, and section C) and inrush current quantities that indicate a normal range and an abnormal range may be set for each split time interval. Further, the time interval and a current range which are described in the following Table 1 may be generated from inrush current information provided from lamp manufacturers, but are not necessarily limited to the following Table 1.

TABLE 1

|  | Section A | Section B | Section C |
|---|---|---|---|
| Time (msec) | 2.6~5.0 | 5.1~7.5 | 7.6~10 |
| Normal current range | 27 < inrush current < 40 | 22 < inrush current < 27 | 18 < inrush current < 22 |
| Abnormal current range | 27 > inrush current, 40 < inrush current | 22 > inrush current, 27 < inrush current | 18 > inrush current, 22 < inrush current |

When any of the lamps mounted within the vehicle are disconnected, the output 150 may be configured to output a warning alarm for the disconnection by the control of the controller 160. In addition, output 150 may be configured to output information regarding the nearest service center from a current position of the vehicle by the control of the controller 160.

The controller 160 may be configured to confirm a turn on state of the multi-function switch when the power supply 120 supplies power to the vehicle. When the multi-function switch is in the turn on state, the controller 160 may be configured to execute the lamp control algorithm stored in the memory 140 to analyze the flicker signals of the lamps received via the interface 110 based on the set protocol to operate the lamp based on the operation of the vehicle and the driving intention of the driver, thereby adjusting the flickering of the corresponding lamp.

When the multi-function switch is in a turn off state, the controller 160 may be configured to supply the operation power to at least one of the lamps mounted within the vehicle through the driver 130. The controller 160 may then be configured to use a lamp selected by a vehicle driver as a target lamp to detect the disconnection to supply the operation power and supply the operation power to all the lamps mounted within the vehicle. Hereinafter, an example in which the disconnection of the target lamp is detected will be described.

When the operation power is supplied, the controller 160 may be configured to measure the inrush current values generated from the lamps for each time interval (e.g., the inrush current values may be measured using various sensors 151). The controller 160 may be configured to compare the measured inrush current values for each time interval with the normal current range and the abnormal current range of Table 1. When all the inrush current values measured in the section A, the section B, and the section C do not continuously correspond to the normal current range, the controller 160 may be configured to detect that the disconnection of the lamps.

In response to detecting the disconnection, the controller 160 may be configured to output an alarm to notify a user (e.g., a vehicle driver) of the disconnection. In particular, the controller 160 may be configured to operate a global positioning sensor (GPS) (not illustrated) mounted within a vehicle to detect a current position of the vehicle and search for information regarding a nearest service center from the current position and output the result to the output 150. Further, the controller 160 may be configured to transmit a message that provides a notification regarding the lamp disconnection to the nearest service center from the current position of the vehicle.

When all the inrush current values measured in the section A, the section B, and the section C correspond to the normal current range or the inrush current values measured in the section A, the section B, and the section C do not continuously correspond to the normal current range less than three times, the controller 160 may be configured to execute the lamp control algorithm stored in the memory 140 to analyze the flicker signals of the lamps received via the interface 110 based on the set protocol to operate the lamp based on the operation of the vehicle and the driving intention of the driver, thereby adjusting the flickering of the corresponding lamp.

Figure 2:
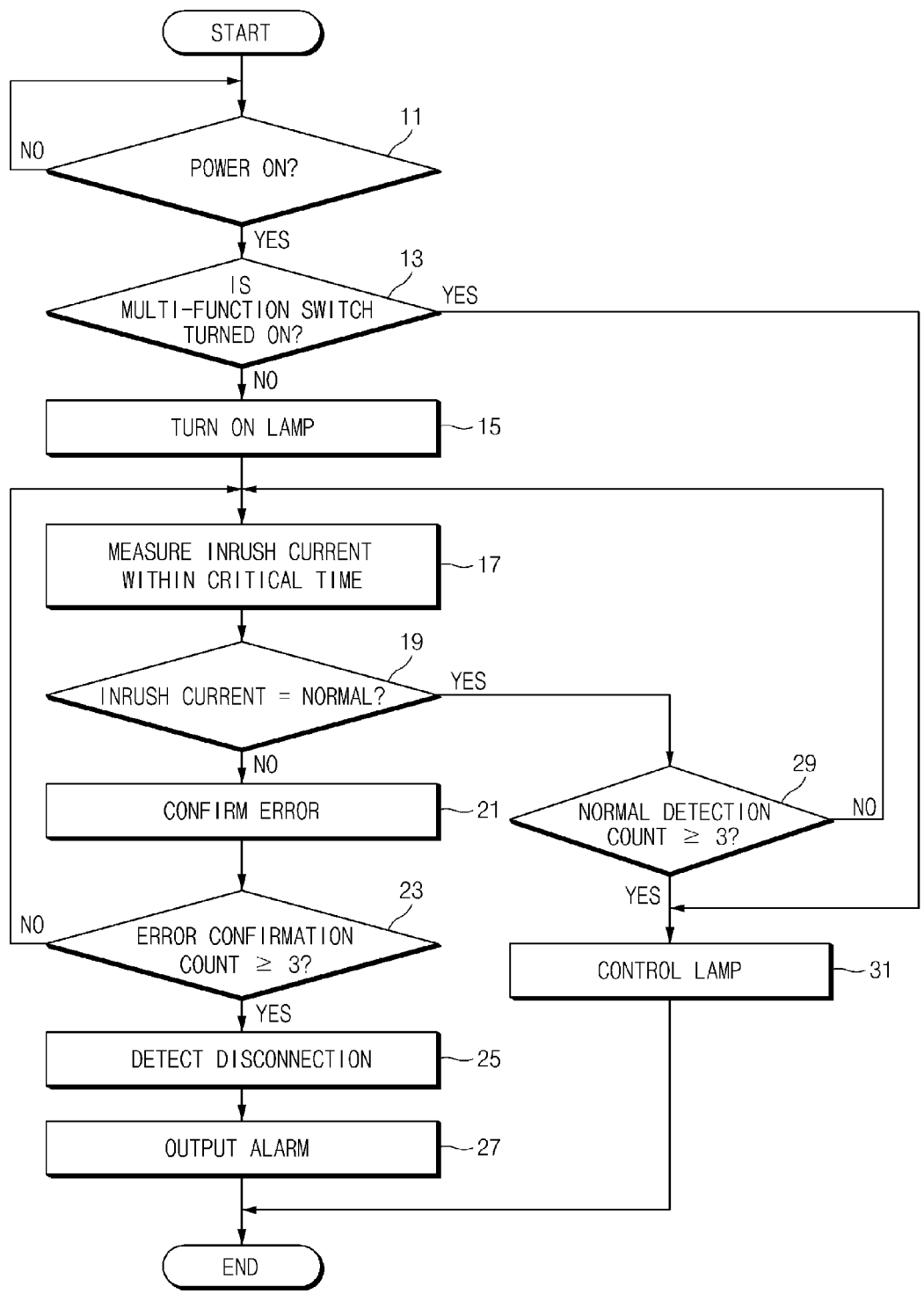
FIG. 2 is an exemplary flow chart for describing a method for detecting a disconnection of lamps according to the exemplary embodiment of the present disclosure.

FIG. 2 is an exemplary flow chart for describing a method for detecting a disconnection of lamps according to the exemplary embodiment of the present disclosure. Referring to FIG. 2, in step 11, the controller 160 may be configured to confirm that power is supplied to the vehicle through the power supply 120. When the power supply of the vehicle is turned on, the controller 160 may be configured to perform step 13 and when it is not confirmed that the power supply is turned on, the controller 160 may be configured to wait for the turn on of the power supply.

In step 13, the controller 160 may be configured to determine whether the multi-function switch is turned on. When the multi-function switch is in a turn off state, the controller 160 may be configured to perform step 15 and when the multi-function switch is in a turn on state, the controller 160 may be configured to perform step 31. In step 31, the controller 160 may be configured to operate the lamp based on the operation of the vehicle and the driving intention of the driver. Accordingly, the controller 160 may be configured to execute the lamp control algorithm previously stored in the memory 140.

In step 15, the controller 160 may be configured to supply the operation power to at least one of the lamps to turn on the particular lamp. In particular, the controller 160 may use a lamp selected by a driver or a user as a target lamp to detect the disconnection to supply the operation power and supply the operation power to all the lamps mounted within the vehicle. Hereinafter, an example in which the disconnection of the target lamp is detected will be described.

In step 17, the controller 160 may be configured to measure the inrush current generated from the lamp supplied with the operation power for the critical time. Particularly, the controller 160 may be configured to split the critical time into the plurality of time intervals and measure the inrush currents for each split time interval. The plurality of time intervals are shown above in Table 1. The controller 160 may further be configured to filter the inrush current in an interval of about 0 to 2.5 msec in consideration of a deviation of an initial inrush current value and noise.

In step 19, the controller 160 may be configured to determine whether the inrush current in the section A is normal (e.g., within the normal range). When the inrush current in the section A is normal, the controller 160 may be configured to perform step 29. When the inrush current is detected to be normal three times or more in step 19, the controller 160 may be configured to perform step 31. When the inrush current is detected to be normal less than three times in step 19, the controller 160 may return to step 17 to again perform the above steps. For example, the inrush current in the section B may be measured in step 17.

Further, when the inrush current in the section A is not normal (e.g., is within the abnormal range), the controller 160 may be configured to perform step 21. The controller 160 may further be configured to determine errors in the lamp in step 21 and perform step 23. When the error confirmation count which occurs in the lamp is less than three times in step 23, the controller 160 may return to step 17 to again perform the above steps. For example, the inrush current of the section B may be measured in step 17.

When the error confirmation count which occurs in the lamp is three times or more in step 23, the controller 160 may perform step 25. In step 25, the controller 160 may be configured to detect that the disconnection of the lamps occurs. In step 27, the controller 160 may be configured to operate the output 150 to output an alarm informing a user or vehicle driver of the lamp disconnection occurrence. According to the exemplary embodiment of the present disclosure, the error confirmation count and the normal detection count are three times but are not necessarily limited thereto. Therefore, it is to be noted that the error confirmation count and the normal detection count may be changed by manufacturers, and the like.

Although not illustrated, the controller 160 may be configured to operate the GPS sensor (not illustrated) mounted within the vehicle to detect the current position of the vehicle and search for information regarding the nearest service center from the current position and output the searched result to the output 150. Further, the controller 160 may be configured to transmit a message regarding the lamp disconnection to the nearest service center from the current position of the vehicle.

As described above, according to the apparatus and method for detecting a disconnection of lamps in accordance with the exemplary embodiments of the present disclosure, it may be possible to detect whether the lamps are disconnected after the vehicle starts by detecting whether the lamps are disconnected by confirming the inrush current values for each time interval after the vehicle starts.

Further, according to the apparatus and method for detecting a disconnection of lamps in accordance with the exemplary embodiments of the present disclosure, it may be possible to more rapidly rectify a disconnection of lamps by confirming the information regarding the nearest service center from the current position of the vehicle by detecting whether the lamps are disconnected.

The exemplary embodiments of the present disclosure disclosed in the present specification and the accompanying drawings have been provided only as specific examples in order to assist in understanding the present disclosure and do not limit the scope of the present disclosure. Therefore, it is to be understood that in addition to the exemplary embodiments of the present disclosure described herein, all the changed or modified forms derived from the technical spirit of the present disclosure are included in the scope of the present disclosure.

What is claimed is:

1. An apparatus for detecting a disconnection of lamps, comprising:
    a power supply configured to supply power to a vehicle;
    a controller configured to:
    receive operate power for at least one lamp mounted within the vehicle;
    supply the operation power to the at least one lamp;
    measure a inrush current value generated from the at least one lamp a plurality of time intervals, wherein the controller measures the inrush current values using a sensor; and
    determine the disconnection of the at least one lamp based on whether the measured inrush current value is normal.

2. The apparatus according to claim 1, wherein the controller is configured to supply the power and confirm whether a multi-function switch is turned on or off.

3. The apparatus according to claim 2, wherein the controller is configured to supply the operation power to the at least one lamp when the multi-function switch is turned off and execute a pre-stored lamp control algorithm to operate the at least one lamp when the multi-function switch is in a turn on state.

4. The apparatus according to claim 2, wherein the controller is configured to supply the operation power to the at least one lamp and then split a critical time into the plurality of time intervals and measure the inrush current values for each time interval.

5. The apparatus according to claim 4, wherein the controller is configured to detect an error in the at least one lamp when the inrush current values for the plurality of time intervals are beyond a normal range.

6. The apparatus according to claim 5, wherein the controller is configured to detect the disconnection when the confirmed error count is equal to or greater than a threshold value and output the confirmed result.

7. The apparatus according to claim 1, wherein the controller is configured to determine information regarding the nearest service center from the vehicle.

8. A method for detecting a disconnection of lamps, comprising:
    detecting, by a controller, a power on of a vehicle;
    supplying, by the controller, operation power to at least one lamp mounted within the vehicle when the power on is detected;
    supplying, by the controller, the operation power to the at least one lamp and measuring inrush current values generated from the at least one lamp for a plurality of time intervals, wherein the controller measures the inrush current value using a sensor;
    determining, by the controller, the disconnection of the at least one lamp based whether on the measured inrush current value is normal; and
    outputting, by the controller, the disconnection determination result.

9. The method according to claim 8, further comprising:
    after detecting the power on of the vehicle, confirming, by the controller, whether a multi-function switch is turned on or off.

10. The method according to claim 9, wherein the supplying of the operation power to the at least one lamp includes:
    supplying, by the controller, the operation power to the at least one lamp when the multi-function switch is in a turn off state.

11. The method according to claim 10, further comprising:
    executing, by the controller, a pre-stored lamp control algorithm to operate the at least one lamp when the multi-function switch is in a turn on state.

12. The method according to claim 9, wherein the determining of the disconnection of the at least one lamp includes:
    splitting, by the controller, a critical time into the plurality of time intervals after the operation power is supplied to the at least one lamp; and
    measuring, by the controller, the inrush current values for each of the plurality of split time intervals.

13. The method according to claim 12, wherein the determining of the disconnection of the at least one lamp includes:
    determining, by the controller, an error in the at least one lamp when the measured inrush current values is beyond a normal range; and
    detecting, by the controller, that the disconnection occurs when an error count is equal to or greater than a threshold value.

14. The method according to claim 8, further comprising:
    after outputting the disconnection detection result, confirming and outputting, by the controller, information regarding a nearest service center from the vehicle.

* * * * *